United States Patent [19]
Johnson et al.

[11] Patent Number: 6,030,254
[45] Date of Patent: Feb. 29, 2000

[54] EDGE CONNECTOR INTERPOSING PROBE

[75] Inventors: Kenneth W. Johnson; Thomas J. Zamborelli, both of Colorado Springs, Colo.

[73] Assignee: Hewlett-Packard Company, Palo Alto, Calif.

[21] Appl. No.: 09/071,104

[22] Filed: May 1, 1998

[51] Int. Cl.[7] .................................................. G01R 31/02
[52] U.S. Cl. .......................... 439/496; 324/754; 439/494; 439/945
[58] Field of Search .............................. 439/67, 912, 945, 439/77, 496, 494; 324/754, 755, 73.1, 758, 537

[56] References Cited

U.S. PATENT DOCUMENTS

| | | | |
|---|---|---|---|
| 3,696,319 | 10/1972 | Olsson | 439/77 |
| 3,808,532 | 4/1974 | Yuska | 324/755 |
| 4,042,289 | 8/1977 | Heinonen et al. | 439/629 |
| 4,924,179 | 5/1990 | Sherman | 324/755 |
| 4,997,377 | 3/1991 | Goto et al. | 439/67 |
| 5,040,993 | 8/1991 | Krug et al. | 439/75 |
| 5,692,911 | 12/1997 | Webster et al. | 439/67 |

OTHER PUBLICATIONS

"Pentium Pro, Pentium II, and Mobile Pentium II Processor In–Circuit Emulators" Internet download, American Arium, Apr. 20, 1998.

"Pentium Pro & Pentium II Processor In–Circuit Emulators" brochure by American Arium, 1997.

*Primary Examiner*—Neil Abrams

[57] ABSTRACT

An edge connector interposing probe (100) for testing the operation of two electrical assemblies which normally couple to one another via edge connectors. The interposing probe has a male edge connector (208/210) which fits into an edge connector of the first assembly, and a female edge connector (102) which receives an edge connector of the second assembly. Solder tails (200, 202) of the interposing probe's female edge connector are coupled to traces (208, 210) of the interposing probe's male edge connector, and to transmission paths (204) in one or more flex circuits (106). Signals flowing between the interposing probe's edge connectors are sensed by the transmission paths of the flex circuit(s) and routed to test connectors (108, 110, 112, 114, 116). Probe tip resistors (422, 424) can be coupled to the transmission paths at points which are proximate to the interposing probe's edge connectors. In this manner, the transmission paths behave as transmission lines, and sensed signals are transmitted to the interposing probe's test connectors with very little degradation. The flex circuits allow the probe tip resistors to be placed closer to the interposing probe's edge connectors than was previously possible. The manner in which the interposing probe's edge connectors and flex circuits are coupled shortens the series length introduced between the edge connectors of the first and second electrical assemblies. The flexibility of the flex circuits allows the interposing probe to be used in crowded circuit environments.

30 Claims, 11 Drawing Sheets

EDGE CONNECTOR INTERPOSING PROBE

FIELD OF THE INVENTION

The invention pertains to edge connector interposing probes, and more specifically, to an edge connector interposing probe which 1) adds minimal length (and therefore minimal delay) to the routes of signals passing through an edge connector, 2) places a negligible load on signal routes being probed, and 3) is usable in confined and/or obstructed environments.

BACKGROUND OF THE INVENTION

Electrical subassemblies are often connected to one another via card edge connectors, of which there are two types. A female edge connector comprises one or more slots. Electrical contacts interior to the one or more slots terminate exterior to the edge connector in a plurality of solder tails (or any other suitable contact means). A male edge connector comprises a plurality of edge connector traces which are formed on, and arranged perpendicularly to, the edge of a PC board. In order to connect two electrical subassemblies comprising edge connectors, a male edge connector of a first subassembly is inserted into a female edge connector of a second subassembly. Intel®'s Pentium® II microprocessor is an example of a subassembly comprising a male edge connector. The male edge connector of a Pentium® II microprocessor comprises 242 edge connector traces arranged on opposite sides of two tabs of a PC (printed circuit) board to which the components of the Pentium® II microprocessor are electrically coupled. The Pentium® II edge connector is commonly known as a Slot 1 edge connector.

After proper operation of an electrical subassembly has been verified, it is usually necessary to evaluate the subassembly's interaction with one or more other subassemblies (e.g., a microprocessor's interaction with an external chip set, RAM, peripheral interfaces, and other components connected to a computer's motherboard). This is typically accomplished by inserting an edge connector interposing probe between the two subassemblies.

An edge connector interposing probe is a device which forms a series bridge between the edge connectors of two subassemblies. Signals passing through the bridge are "probed". That is, the signals are sampled and routed to test equipment such as a logic analyzer.

However, currently available edge connector interposing probes pose a number of problems. First, they add a significant series length to the path of a signal being probed. This added length can cause unwanted signal delay, which in turn can lead to induced performance losses and even errors in a device under test. Second, currently available edge connector interposing probes tend to induce a lot of "crosstalk" (or noise) into signals being monitored. If there is too much crosstalk, signals received by test equipment may be inaccurate representations of the signals transmitted between the two subassemblies, and/or two subassemblies connected via the interposing probe may fail to communicate as intended. Finally, currently available edge connector interposing probes can place substantial loads on signal routes being probed—further disturbing the proper functioning of a device under test.

SUMMARY OF THE INVENTION

To alleviate the aforementioned problems, the inventors have devised a new edge connector interposing probe, and methods of making and using same.

In their simplest form, the probes described herein comprise a female edge connector, one or more test equipment connectors, and a flex circuit which connects the female edge connector to the test equipment connectors.

Like conventional edge connector interposing probes, the probes described herein are inserted in series with the signals being measured. However, the series length added to a probed signal route is greatly reduced. This is primarily accomplished by routing probed signals to test equipment via one or more flex circuits. A flex circuit is a thin circuit formed by sandwiching one or more signal layers between a number of flexible, plastic insulating sheets.

In one embodiment of the invention, a flex circuit is conformed to a support member to form a male edge connector which may be inserted into a female edge connector on a PC board. In another embodiment of the invention, a flex circuit is sandwiched between a female edge connector, and a support member having a male edge connector formed thereon. In yet another embodiment of the invention, the support member is dispensed with, and a flex circuit is sandwiched between a female edge connector and a PC board. In all embodiments, signals passing through an edge connector are probed by transmission paths formed in one or more flex circuits.

To reduce loading on probed signal routes, a probe tip resistor is coupled to each transmission path at a point in the transmission path which is very close to a signal route being probed. The use of flex circuits to route signals away from a device under test allows probe tip resistors to be placed very close to points where signal routes are being probed (thereby ensuring that the smallest possible loads are placed on probed signal routes).

To ensure that test equipment receives probed signals without delay, and with very little signal degradation, the transmission paths in a flex circuit are configured as transmission lines, and test equipment probes connected to the aforementioned test equipment connectors are impedance matched to the transmission paths of the flex circuit.

In addition to offering the above electrical advantages, the probes described herein are associated with a shorter "lever arm" so that smaller moments (torques) are transferred to a connection being probed.

These and other important advantages and objectives of the present invention will be further explained in, or will become apparent from, the accompanying description, drawings and claims.

BRIEF DESCRIPTION OF THE DRAWINGS

Illustrative and presently preferred embodiments of the invention are illustrated in the drawings, in which.

DESCRIPTION OF THE PREFERRED EMBODIMENT

1. In General

Figure 1:
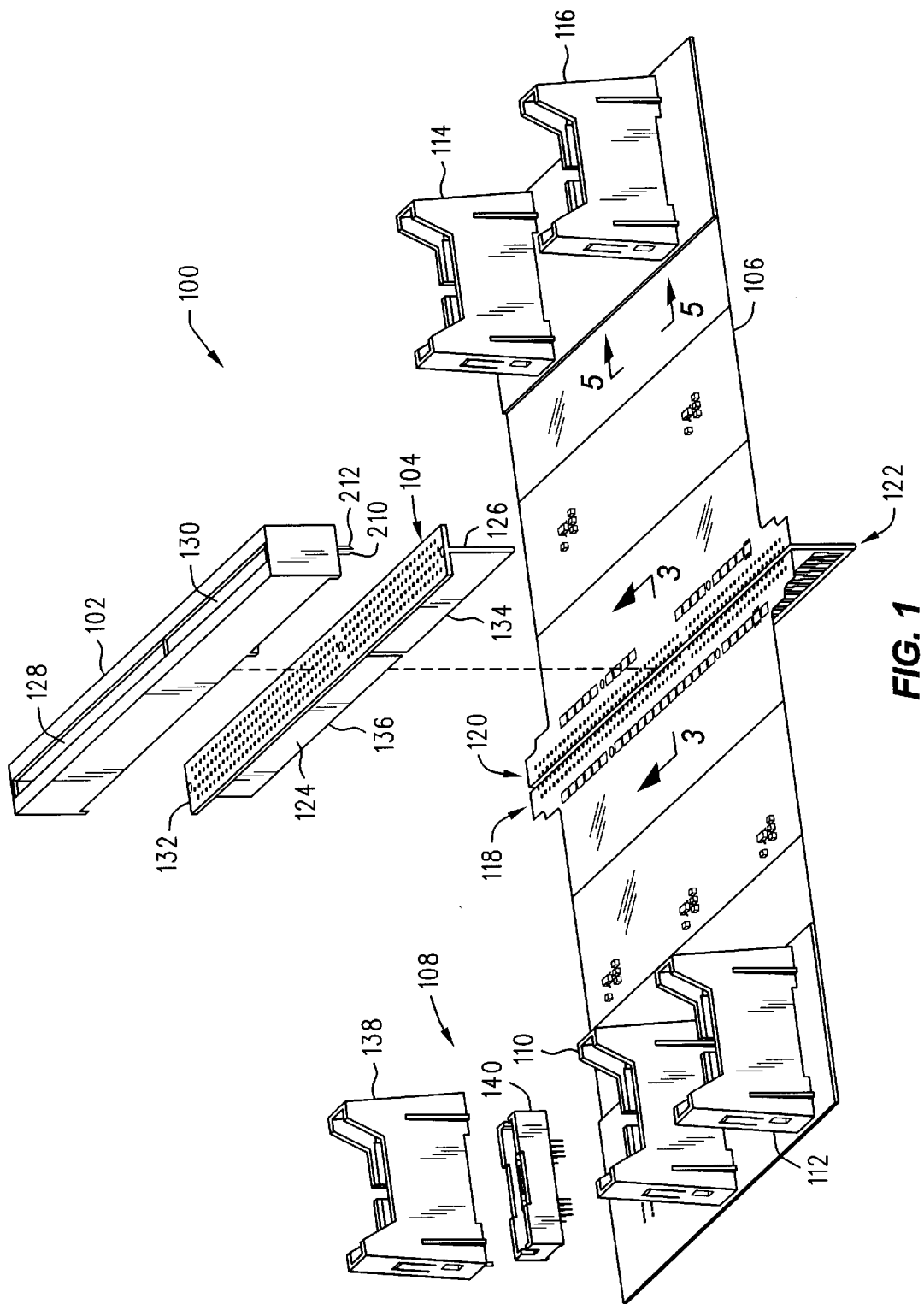
FIG. 1 is a perspective view (first angle) of a first embodiment of an edge connector interposing probe.
Figure 2:
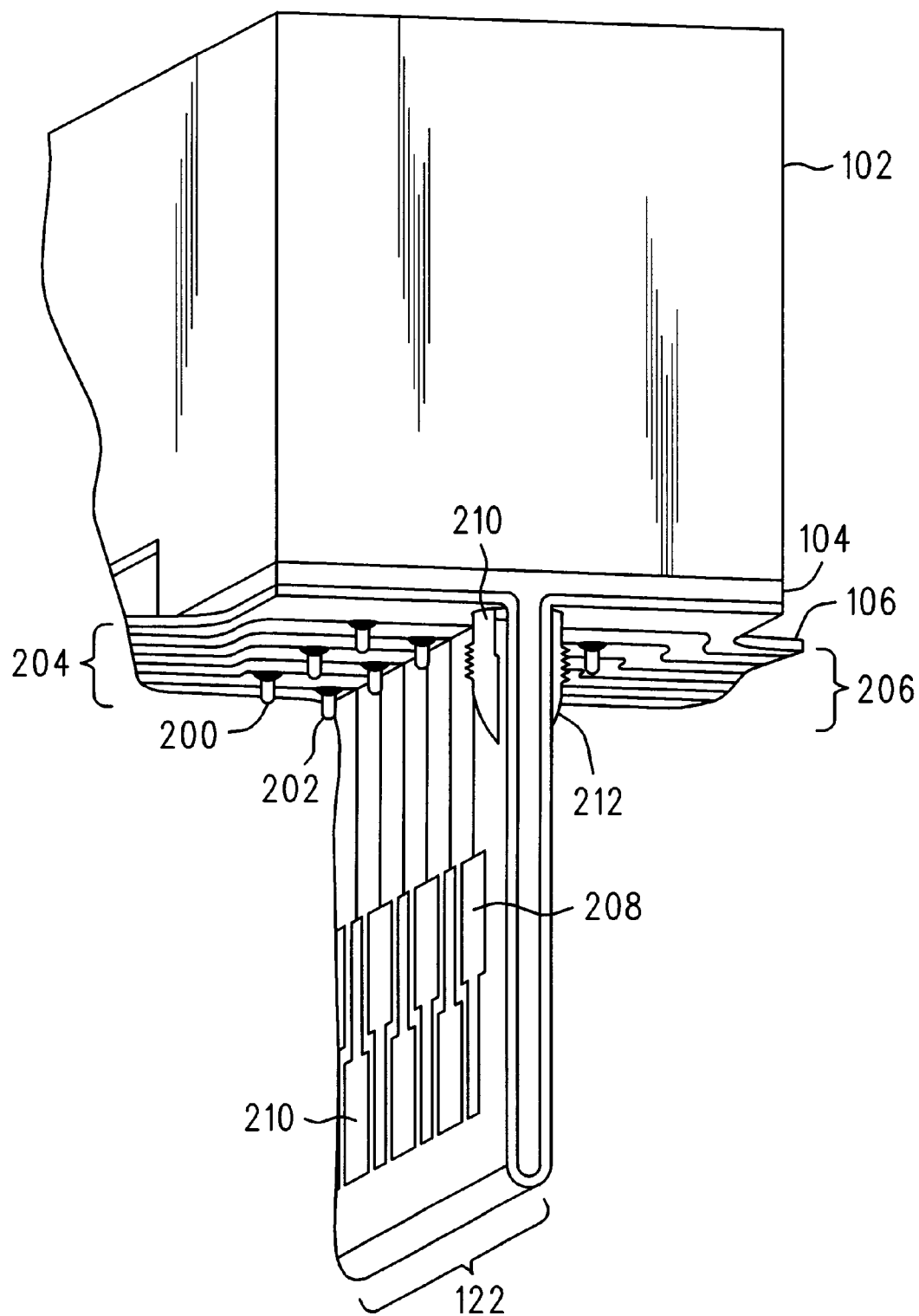
FIG. 2 is a perspective view (second angle) of an end portion of the FIG. 1 edge connector interposing probe.

A first embodiment of an edge connector interposing probe 100 is pictured in FIGS. 1–4, and may generally comprise a first edge connector 102 having a plurality of solder tails 200, 202 extending therefrom, a T-shaped support member 104, at least one flex circuit 106 having a plurality of transmission paths 204, 206 formed therein, and at least one test equipment connector 108–116 which is electrically coupled to a subset of the plurality of transmission paths 204, 206 of the at least one flex circuit 106. The at least one flex circuit 106 also has at least one first portion 118, 120 in which various ones of the plurality of transmission paths 204, 206 are electrically coupled to various ones of the plurality of solder tails 200, 202, and at least one second portion 122 which conforms to at least one surface 124, 126 of the support member 104. The at least one second portion 122 comprises exposed portions 208, 210 of a subset of the plurality of transmission paths 204, 206, which exposed portions 208, 210 form traces of a second edge connector.

Figure 6:
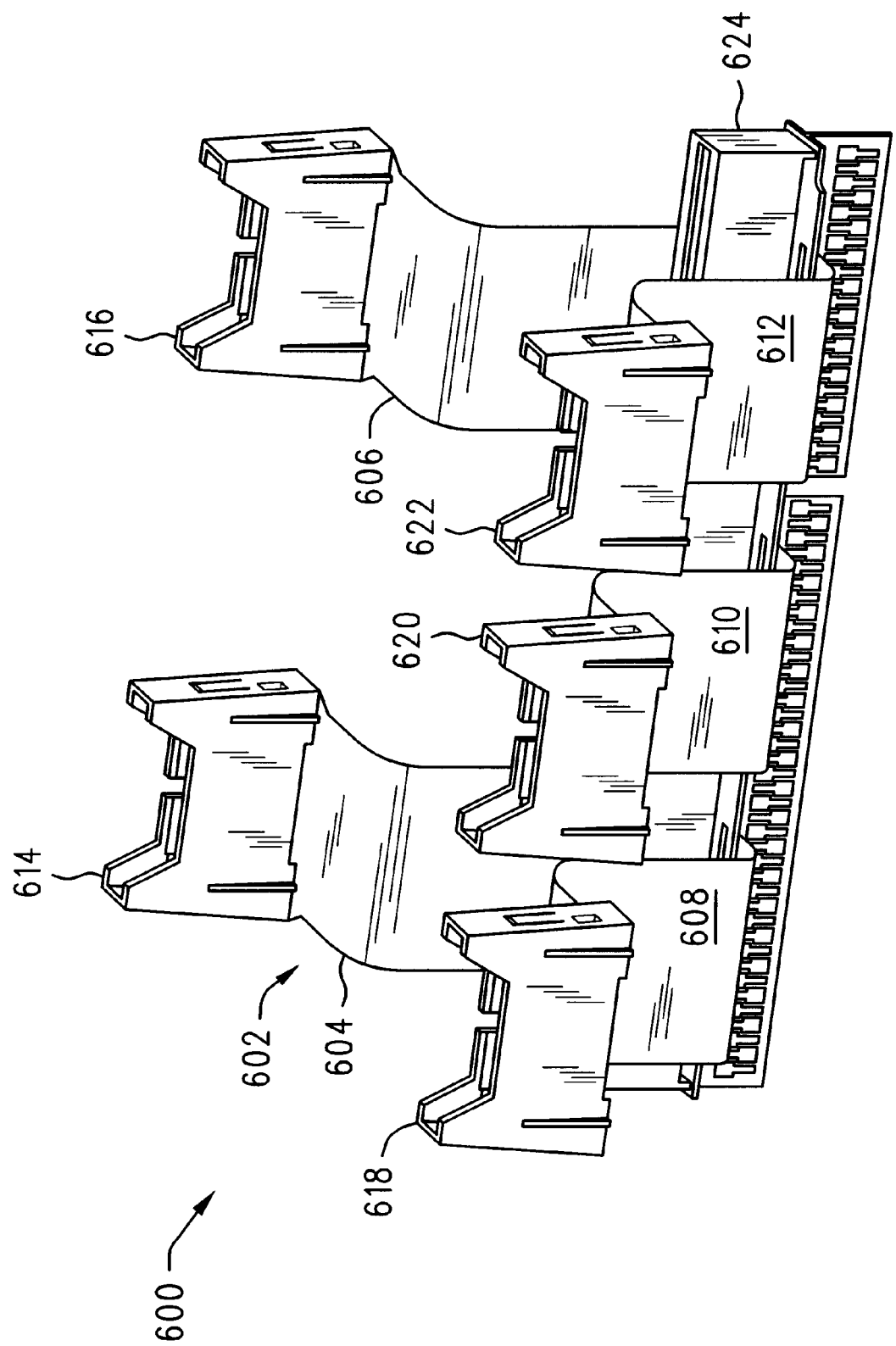
FIG. 6 is a perspective view of a second embodiment of an edge connector interposing probe.

A second embodiment of an edge connector interposing probe 600 is pictured in FIG. 6, and differs from the first embodiment of an edge connector interposing probe 600 in that the flex circuit 602 comprises additional, independently maneuverable arms 604–612.

Figure 7:
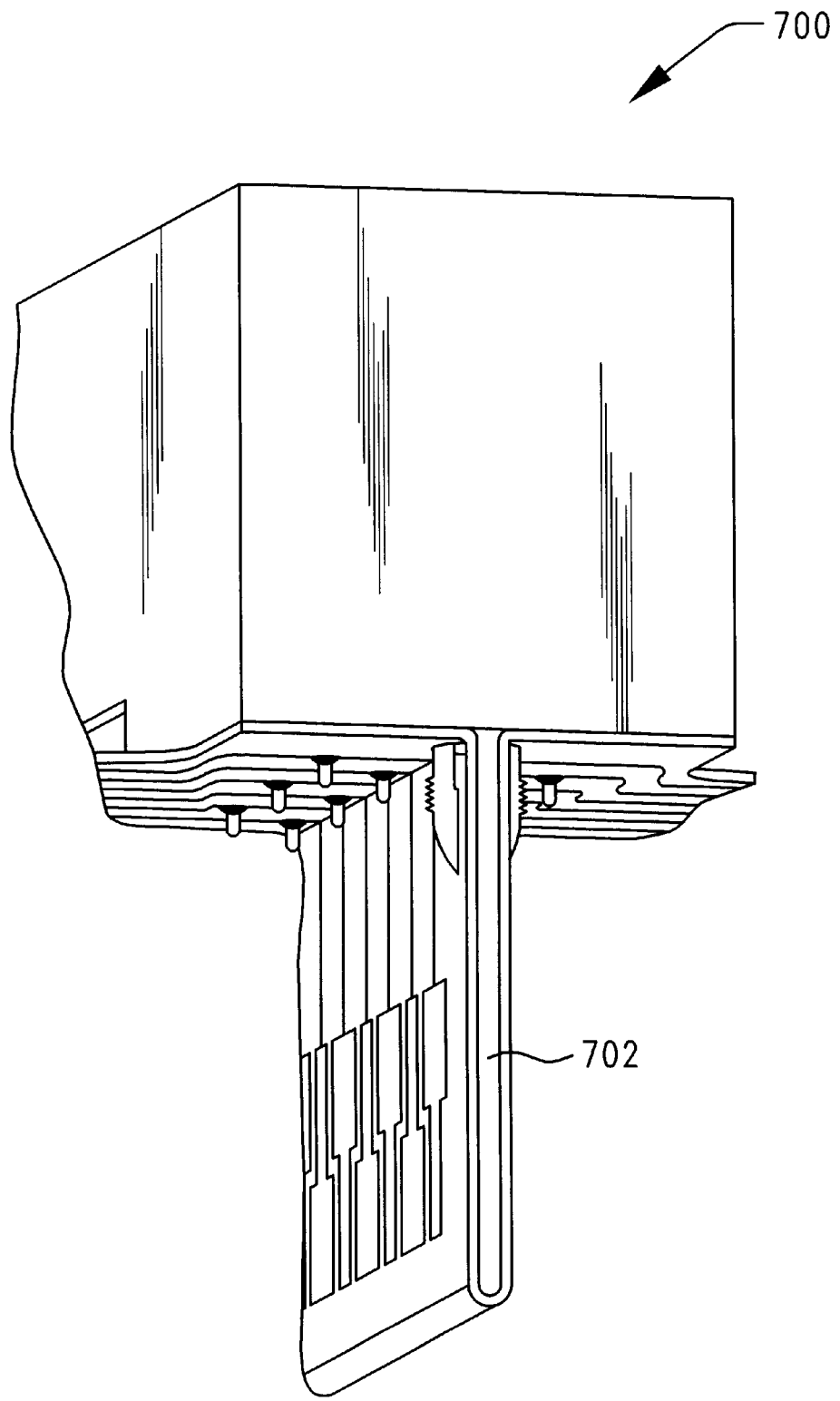
FIG. 7 is a perspective view (second angle) of an end portion of a third embodiment of an edge connector interposing probe.

A third embodiment of an edge connector interposing probe 700 is pictured in FIG. 7, and differs from the first embodiment of an edge connector interposing probe 100 in that the support member 702 is planar rather than T-shaped.

Figure 8:
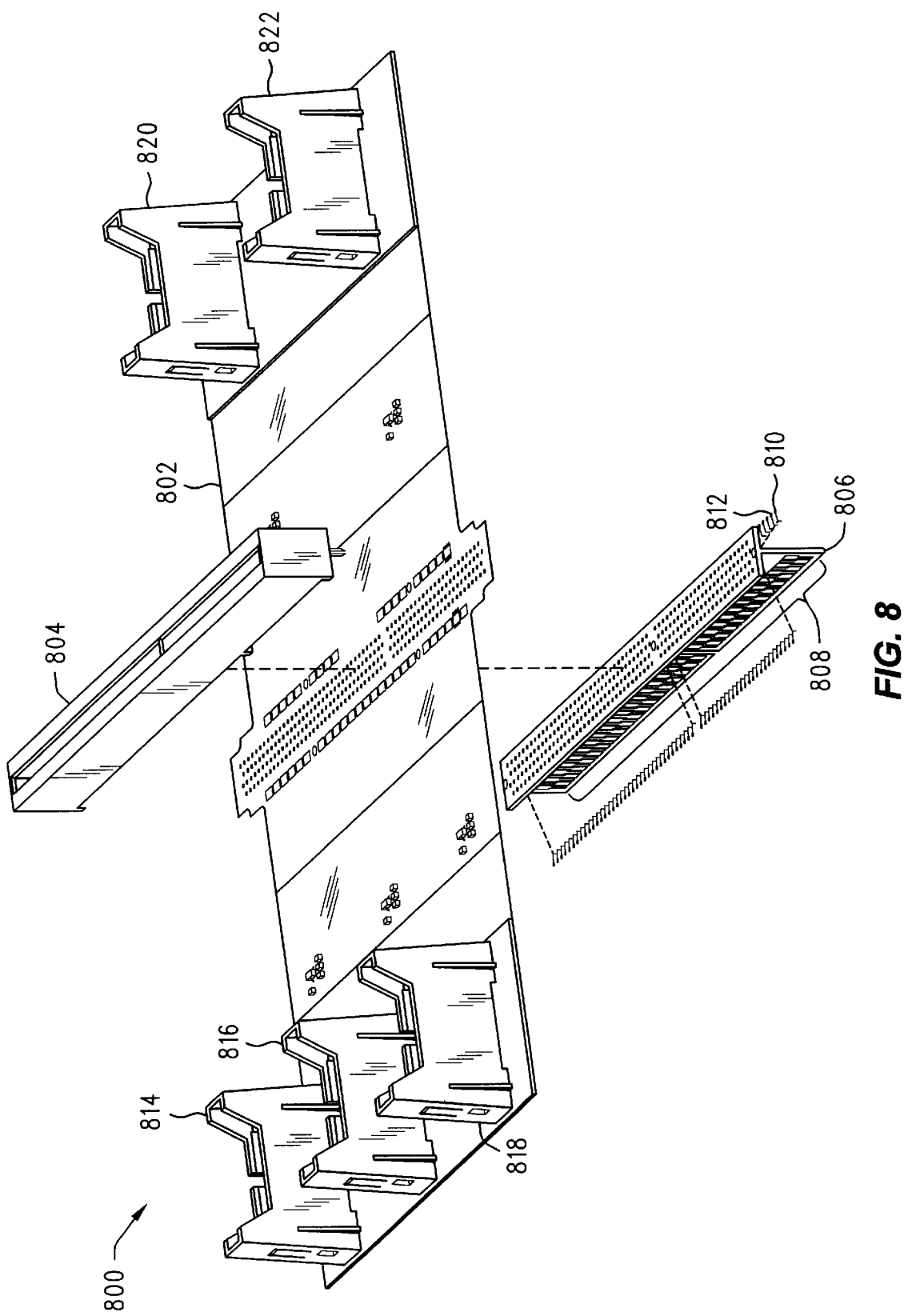
FIG. 8 is a perspective view (first angle) of a fourth embodiment of an edge connector interposing probe.
Figure 9:
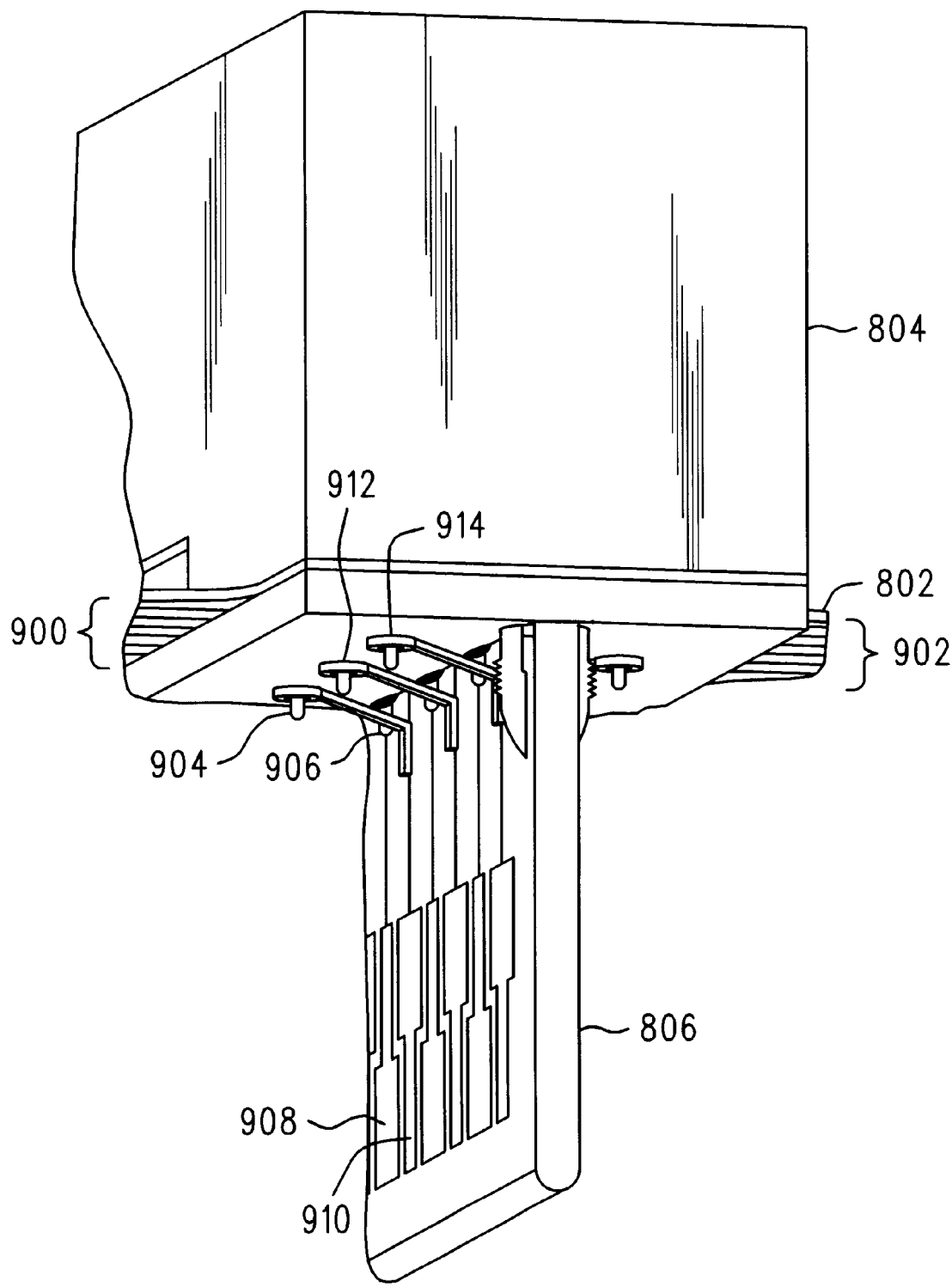
FIG. 9 is a perspective view (second angle) of an end portion of the FIG. 8 edge connector interposing probe.

A fourth embodiment of an edge connector interposing probe 800 is pictured in FIGS. 8 and 9, and may generally comprise at least one flex circuit 802 having a plurality of transmission paths 900, 902 formed therein, a first edge connector 804 having a plurality of solder tails 904, 906 extending therefrom, a T-shaped support member 806 having a second edge connector 808 formed thereon, means 810, 812 for electrically coupling the plurality of solder tails 904, 906 of the first edge connector 804 to traces 908, 910 of the second edge connector 808, and at least one test equipment connector 814–822 which is electrically coupled to a first subset of the plurality of transmission paths 900, 902 of the at least one flex circuit 802. The plurality of solder tails 904, 906 are electrically coupled to a second subset of the plurality of transmission paths 900, 902 of the at least one flex circuit 802.

Figure 11:
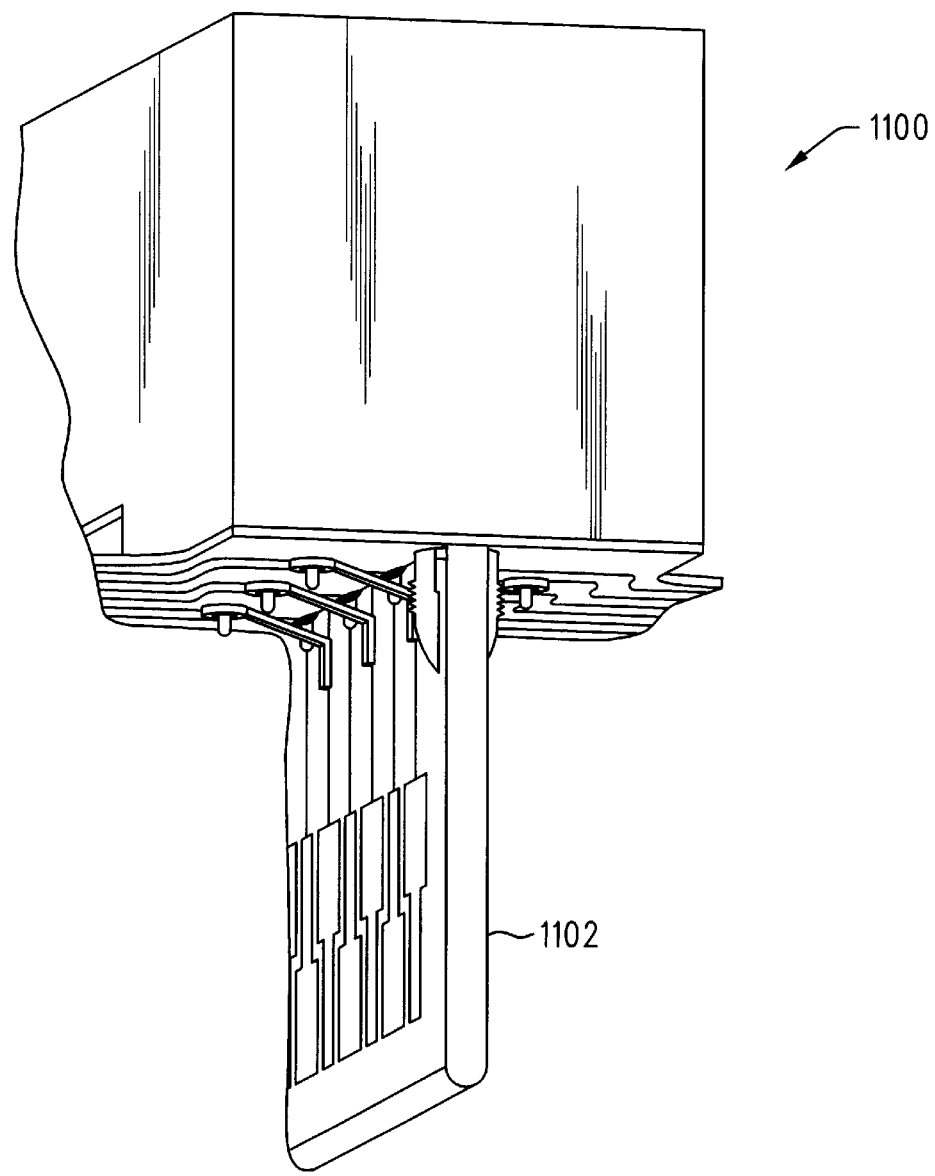
FIG. 11 is a perspective view (second angle) of an end portion of a fifth embodiment of an edge connector interposing probe.

A fifth embodiment of an edge connector interposing probe 1100 is pictured in FIG. 11, and differs from the fourth embodiment of an edge connector interposing probe 800 in that the support member 1102 is planar rather than T-shaped.

Figure 12:
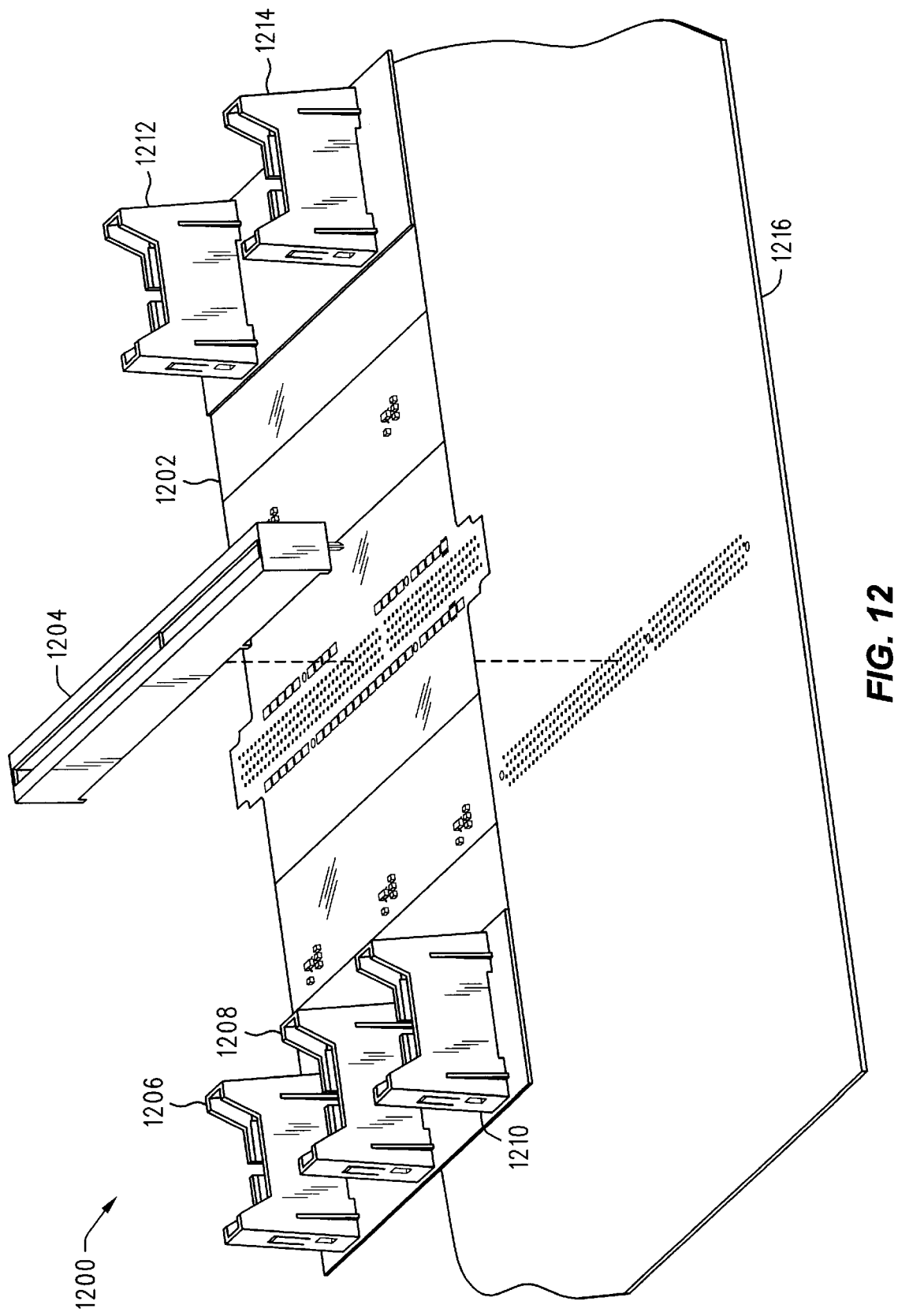
FIG. 12 is a perspective view (first angle) of a sixth embodiment of an edge connector interposing probe.

A sixth embodiment of an edge connector interposing probe 1200 is pictured in FIG. 12, and may generally comprise at least one flex circuit 1202 having a plurality of transmission paths formed therein, a first edge connector 1204 having a plurality of solder tails extending therefrom, and at least one test equipment connector 1206–1214 which is electrically coupled to a subset of the plurality of transmission paths of the at least one flex circuit 1202. A subset of the plurality of solder tails are electrically coupled to transmission paths of the at least one flex circuit 1202.

Having described six embodiments of an edge connector interposing probe 100, 600, 700, 800, 1100, 1200 in general, their construction and use will now be described in further detail.

2. A First Embodiment

The first embodiment of an edge connector interposing probe 100 comprises a female edge connector 102, a T-shaped support member 104, a flex circuit 106, and a plurality of test equipment connectors 108–116.

Figure 3:
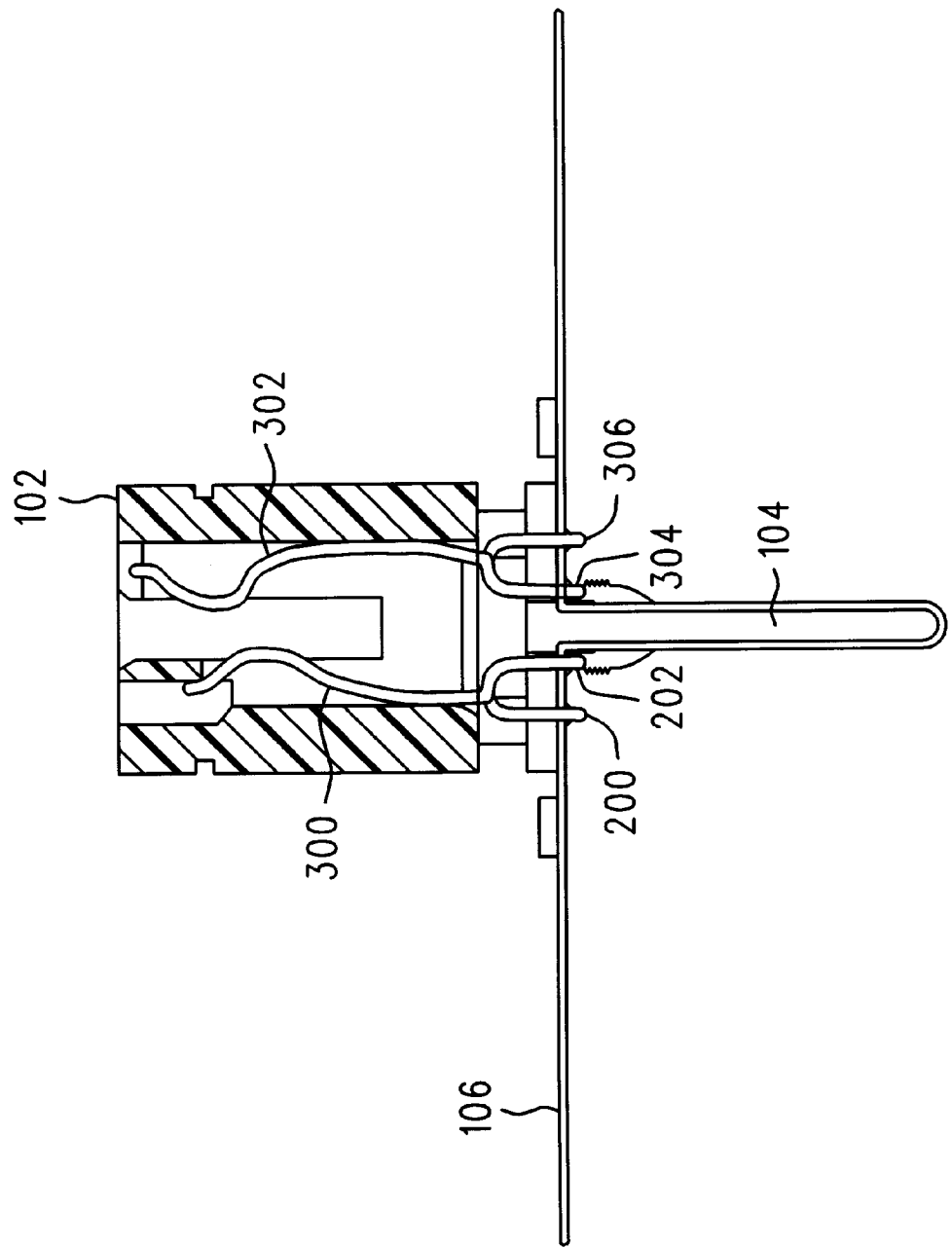
FIG. 3 is an elevational view of a central portion of the FIG. 1 edge connector interposing probe.

Female edge connectors 102 are available from a variety of manufacturers, and come in both standard and custom sizes. By way of example, the edge connector interposing probe 100 illustrated in FIGS. 1–4 incorporates a 1 mm, 242 position, Slot 1 edge connector, which is available through AMP, Inc. of Harrisburg, PA as part number 145251-1. As illustrated in FIG. 3, this edge connector 102 comprises a number of electrical contacts 300, 302 which present themselves internally to the slots 128, 130 of the edge connector 102 and terminate in solder tails 200, 202, 304, 306 extending externally from the edge connector 102.

The T-shaped support member 104 is preferably constructed of FR4 (the fiberglass composite from which most PC (printed circuit) boards are constructed). Alternatively, the support member 104 may be constructed from any other suitable material (e.g, fiberglass, plastic, or a composite material). The crossbar 132 of the T-shaped support member 104 has a plurality of holes drilled therein. For the purpose of the following description and claims, a T-shaped member 104 is understood to inherently comprise a crossbar 132 supported by an upright having two opposite surfaces 124/126. Assuming that female edge connector 102 is a Slot 1 edge connector, 242 of the support member's holes will be aligned to receive the solder tails 200, 202, 304, 306 of the female edge connector 102. Additional holes in the crossbar 132 of the support member 102 may be aligned to engage and lock with centering prongs 210, 212 extending from the edge connector 102 substantially in parallel to its plurality of solder tails 200, 202, 304, 306. Again assuming that female edge connector 102 is a Slot 1 edge connector, the upright of the T-shaped support member 104 will comprise two tabs 134, 136 of differing length, as required by the female edge connector 102 to present mis-insertion.

The flex circuit 106 comprises a number of transmission paths 204, 206. A subset of the transmission paths (possibly all of them) are electrically coupled (e.g., soldered) to the solder tails 200, 202, 304, 306 of the female edge connector 102, and are used to route probed signals to a number of test equipment connectors 108–116 (the probed signals being all or some of the signals which flow through the female edge connector 102). In simplest form, a transmission path comprises a wire conductor 500 (e.g, a copper wire, FIG. 5) which is sandwiched between insulating layers 510, 514 (e.g., plastics) of the flex circuit 106. To reduce crosstalk (e.g., coupling capacitance) between signals carried over the transmission paths 204, 206 of the flex circuit 106, transmission paths 500, 502 may be alternated with ground wires 504–508 over the width of the flex circuit 106.

Figure 5:
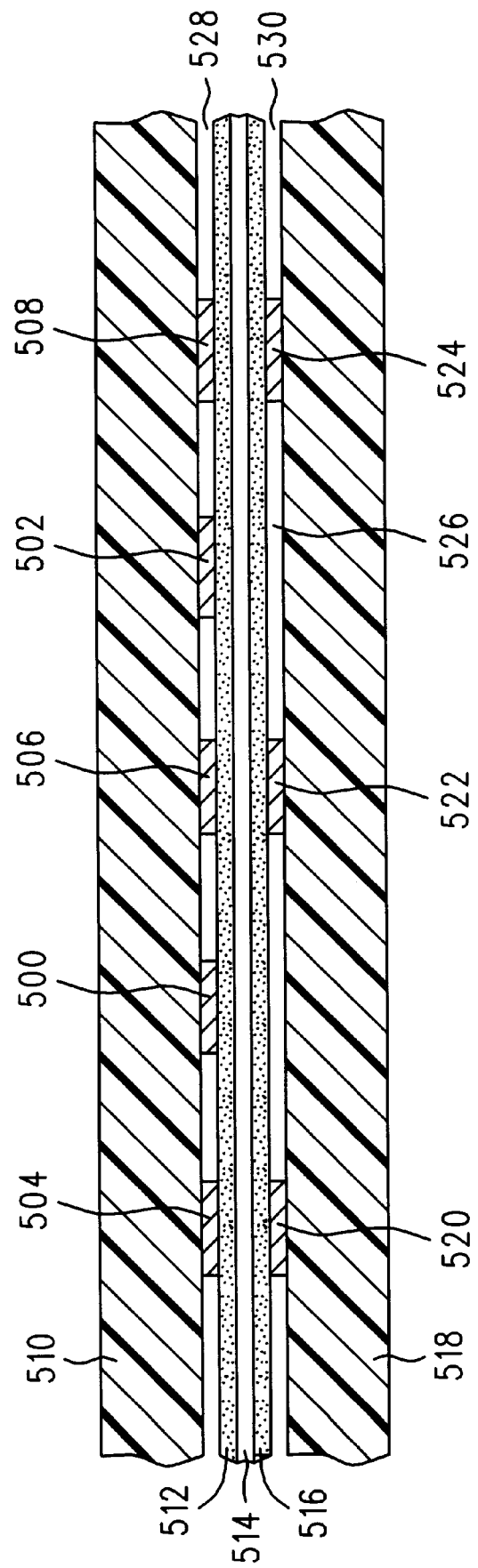
FIG. 5 is a cross-sectional view of the flex circuit of the FIG. 1 edge connector interposing probe.

FIG. 5 illustrates an exemplary cross-section of the FIG. 1 flex circuit 106. The cross-section comprises seven layers. An adhesive layer 512, 516 is applied to each side of a central, plastic insulating layer 514. A number of wire conductors 500–508, 520–524 comprising two signal layers 528, 530 are then placed on top of each adhesive layer 512, 516. Finally, the two signal layers 528, 530 are covered with additional plastic insulating layers 510, 518, and the layers 510–518, 528, 530 are bonded to one another as the adhesive layers 512, 516 flow into spaces between the wire conductors 500–508, 520–524, and/or the insulating layers 510, 518 are drawn into said spaces (e.g., adhesive layer 516 could flow into space 526, or insulating layer 518 could be drawn into space 526 in order to bond with adhesive layer 516).

To further reduce crosstalk between signals carried over the transmission paths 204, 206 of the flex circuit 106, transmission paths 500, 502 may be confined to one signal layer 528, while alternating the transmission paths 500, 502 with ground wires 504–508, 520–524 routed in both signal layers 528, 530. Additionally, transmission paths 500, 502 could be staggered between signal layers 528, 530 (e.g., transmission path 500 could be routed in signal layer 528, and transmission path 502 could be routed in signal layer 530). Limiting transmission paths 500, 502 to only one signal layer 528 also provides for easier drilling into the flex circuit 106 (i.e., there is no danger of hitting an above or below routed transmission path).

A first portion 122 of the flex circuit 106 may be shaped to form a valley which conforms to the support member 104. Along the exterior surfaces of this valley, those transmission paths 204, 206 which are coupled to the solder tails 200, 202, 304, 306 of the female edge connector 102 are exposed to form traces 208, 210 of a male edge connector. Like the support member 104, the male edge connector comprises two tabs (not shown). The flex circuit 106 may be slit as needed to form these tabs.

In second portions 118, 120 of the flex circuit 106, a plurality of holes formed therein are aligned to receive the solder tails 200, 202, 304, 306 of the female edge connector 102. The transmission paths 204, 206 which form the male edge connector circle around (or pass closely to) these holes so that the solder tails 200, 202, 304, 306 of the female edge connector 102 may be electrically coupled to these transmission paths 204, 206 (through soldering or the like).

Figure 4:
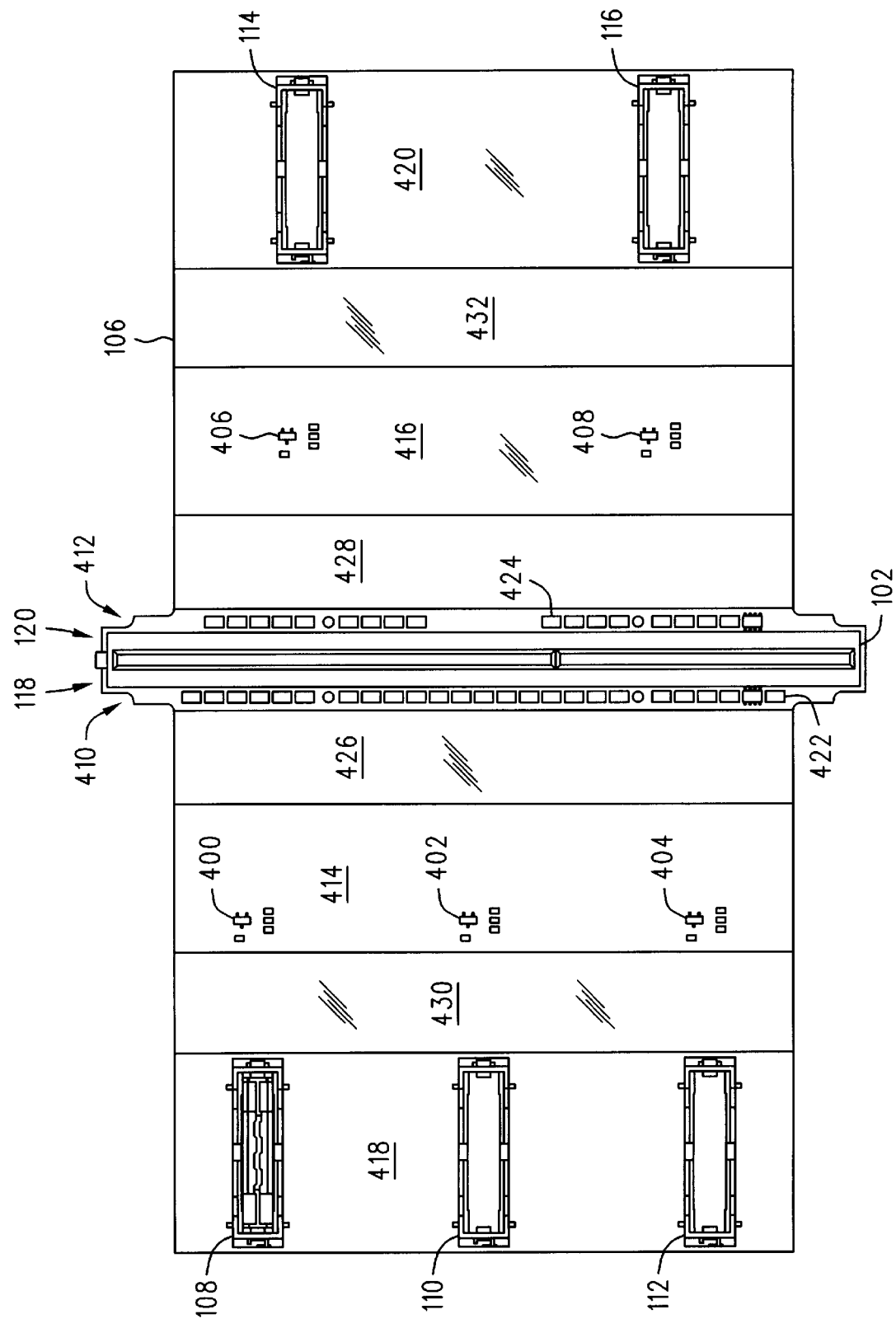
FIG. 4 is a plan view of the FIG. 1 edge connector interposing probe.

Discrete components 400–408, 422, 424 (transistors, diodes, resistors) may be electrically coupled to, or in, transmission paths 204, 206 of the flex circuit 106 in regions 410–420 (FIG. 4). Discrete components are preferably limited to these regions 410–420, since these regions are likely to exhibit less flexing than regions 426–432 (and are therefore better suited for carrying discrete components 400–408, 422, 424).

A plurality of probe tip resistors (e.g., 422, 424) are illustrated in regions 410 and 412. Each of these probe tip resistors 422, 424 is coupled to a transmission path which routes probed signals away from edge connector 102. A preferred value for these probe tip resistors 422, 424 is 420Ω, though this value will vary with manufacturing and process variations. The value selected for a probe tip resistor 422, 424 should be one that is large enough to ensure that a flex circuit transmission path will not place a significant load on a probed signal route (i.e., a probe tip resistor serves to isolate a flex circuit transmission path from an edge connector 102 being probed). To further reduce loading of probed signal paths, the probe tip resistors illustrated in FIG. 4 (e.g., 422, 424) are coupled to transmission paths 204, 206 of the flex circuit 106 at points which are proximate to the points at which the transmission paths 204, 206 are coupled to solder tails 200, 202, 304, 306 of the female edge connector 102. By utilizing flex circuits 106 to route probed signals away from an edge connector 102, probe tip resistors 422, 424 may be placed extremely close to probed signal routes, and hook-up capacitance is minimized.

Transmission paths 204, 206 in a flex circuit 106 preferably behave as transmission lines. As known in the art, a properly terminated transmission line will propagate a signal wavefront, thereby minimizing signal reflection, skew and delay. Transmission paths 204, 206 of a flex circuit 106 should therefore be impedance matched to test equipment probes which will be connected to the test equipment connectors 108–116 on the flex circuit 106. In this manner, each transmission path 204, 206 in the flex circuit 106 forms a part of a transmission line extending substantially between a probed signal route and test equipment.

Regions 414 and 416 may comprise various discrete components 400–408. For example, components 400–408 may serve to buffer clock signals, and at the same time level shift and distribute these clock signals to passive probe cables, where the clock signals may be used to clock information into test equipment. Circuitry in regions 414 and 416 may comprise, for example, transistors, diodes, resistors, and capacitors.

As previously discussed, the transmission paths 204, 206 of the flex circuit 106 route probed signals to one or more test equipment connectors 108–116. The test equipment connectors 108–116 illustrated in FIGS. 1 & 2 comprise two pieces—a Mictor shroud 138 (available from Hewlett-Packard Company of Palo Alto, Calif. as part no. E5346-44701), and an AMP connector post 140 (available from AMP, Inc. as part no. 2-767004-2). Each connector post 140 is electrically coupled to a subset of transmission paths 204, 206 in the flex circuit 106, and serves as a base to which a Mictor shroud 138 is clipped. The subset of transmission paths 204, 206 to which each test equipment connector 108–116 is coupled may be exclusive to a single test equipment connector 112, or alternatively, may comprise some number of transmission paths which are also received by other test equipment connectors 110. The determination as to which signals will be probed through any given test equipment connector 108–116 is application specific.

When using the edge connector interposing probe 100 illustrated in FIGS. 1–4, the male edge connector 208/210 portion of the interposing probe 100 is inserted into a female edge connector which would normally receive a circuit board having an electrical subassembly thereon (e.g., a microprocessor, a chip set, a RAM, or a peripheral interface). The circuit board which has been displaced from its customary socket is then inserted into the female edge connector 102 of the interposing probe 100. Appropriate test equipment is then connected to some or all of test equipment connectors 108–116. Finally, the system in which the edge connector interposing probe 100 is placed is turned on. During normal operation of the system to be tested, signals passing through conductive paths between the male and female edge connectors 102, 208/210 of the interposing probe 100 are sensed by the probe tips of the flex circuit 106 and are routed to connected test equipment. Since the transmission paths 204, 206 of the flex circuit 106 are terminated in close proximity to the probe tips of the transmission paths 204, 206, very accurate readings of signals passing through the edge connector interposing probe 100 may be acquired. Since the series lengths of the conductive paths between the male and female edge connectors 102, 208/210 of the interposing probe 100 are shorter than those found in previous probes, a system in which the interposing probe 100 is mounted is less likely to experience operating anomalies and/or significant signal delay due to the presence of the probe 100. This is especially significant in modern high speed processing systems where signal timing is critical (e.g., in a computer comprising an Intel® Pentium® II microprocessor).

In assembling the edge connector interposing probe 100, the first portion 122 of the flex circuit 106 is conformed to the upright surfaces 124, 126 of the T-shaped support member 104, and then preferably, bonded (e.g., glued) to the T-shaped support member's upright surfaces 124, 126. The flex circuit 106 may also be bonded to the underside of the support member's crossbar 132. Aligned holes in the support member 104 and flex circuit 106 may be drilled prior to (or alternatively, after) the joining of the support member 104 and flex circuit 106. Thereafter, the solder tails 200, 202, 304, 306 of the female edge connector 102 may be inserted through the aligned holes of the support member 104 and the flex circuit 106, and then soldered to transmission paths 204, 206 of the flex circuit 106.

The above described embodiment of an edge connector interposing probe 100 is advantageous over prior edge connector interposing probes in several respects. First, probe tip resistors 422, 424 for the transmission paths 204, 206 may be mounted in closer proximity to the points at which edge connector signals are probed (i.e., very close to the points where solder tails 200, 202, 304, 306 of the female edge connector 102 are soldered to transmission paths 204, 206 of the flex circuit 106). This helps to reduce loading of a device under test. Second, when passive probe cables having characteristic impedances matching those of the flex circuit's transmission paths 204, 206 are coupled to test equipment connectors 108–116 mounted on the flex circuit, probed signals suffer very little degradation as they are routed to a piece of test equipment. Third, the extra distance over which an edge connector signal must travel is greatly reduced when using the above described edge connector interposing probe 100. If the support member 104 has a preferred height of 14.52 mm ±0.50 mm, then the length added to an edge connector signal's path by the above described edge connector interposing probe 100 is approximately 60–70% less over the length added to an edge connector signal's path by previous edge connector interposing probes (such as, for example, the TAP-S1 JTAG adapter manufactured by American Arium of Tustin, Calif.). Though the support member 104 has a preferred height of 14.52±0.50 mm for the embodiments of an edge connector interposing probe disclosed herein, this height range is likely to vary with intended applications.

3. A Second Embodiment

Although the flex circuit 106 illustrated in FIGS. 1–4 is a single, continuous flex circuit, this need not be the case. For example, a second embodiment of an edge connector interposing probe 600 is pictured in FIG. 6, and differs from the first embodiment of an edge connector interposing probe 100 in that its flex circuit 602 comprises independently maneuverable arms 604–612. If each of the independently maneuverable arms 604–612 carries its own test equipment connector 614–622, then test equipment connectors 614–622 may be independently maneuvered into positions which provide for easier connectivity to an edge connector in a hard to reach or obstructed environment. For example, if the arms 604–612 are sufficiently long, arms 604 and 608 could be pulled to the left so that test equipment connectors 614 and 618 could be accessed from one angle, and arms 606, 610 and 612 could be pulled to the right so that test equipment connectors 616, 620 and 622 could be accessed from a different angle, if so needed.

Though not shown, flex circuits 106, 602 illustrated in FIGS. 1–6 may also comprise numerous flex circuit pieces. For example, The flex circuit 106 of FIG. 1 could be slit between each of test equipment connectors 108–116, and at the bottom of the valley in region 122.

4. A Third Embodiment

A third embodiment of an edge connector interposing probe 700 is pictured in FIG. 7, and differs from the first 100 and second 600 embodiments of an edge connector interposing probe in that the support member 702 is planar rather than T-shaped. Similarly to the first embodiment of an edge connector interposing probe 100, the height of the support member is preferably 14.52 mm±0.50 mm.

5. A Fourth Embodiment

Similarly to the first embodiment of an edge connector interposing probe 100, the fourth embodiment of an edge connector interposing probe 800 (FIGS. 8, 9) comprises a female edge connector 804, a T-shaped support member 806, a flex circuit 802, and a plurality of test equipment connectors 814–822. However, the construction and assembly of these elements differs.

The female edge connector 804 may once again be any suitable edge connector having a plurality of solder tails 904, 906 extending therefrom. Likewise, both the flex circuit 802 and the support member 806 have a plurality of holes therein for receiving the solder tails 904, 906 of the female edge connector 804. However, rather than the flex circuit 802 conforming to the support member 806, the flex circuit 802 is sandwiched between the female edge connector 804 and the support member 806.

A male edge connector 808 is formed, in a conventional manner, on one or both upright surfaces of the T-shaped support member 806 (e.g., by etching a substrate on the support member 806). So that the male edge connector 808 may be more easily formed on the T-shaped support member 806, the T-shaped support member 806 may comprise distinct crossbar and upright portions which are assembled (e.g., by gluing) after the male edge connector 808 is formed on the upright portion, and if need be, after a plurality of holes are drilled in the crossbar portion. Other embodiments of an edge connector interposing probe 100, 600, 700, 1100, 1200 may also comprise a support member 104, 702 of two or more portions, as necessitated by manufacturing practicality.

The solder tails 904, 906 of the female edge connector 804 may be coupled to traces 908, 910 of the male edge connector 808 in a variety of ways. If a solder tail 906 is proximate to an upright surface of the support member 806, it is possible to align it with a trace 908 in the male edge connector 808 such that the solder tail 906 may be soldered directly to the trace 908 of the male edge connector 808. If a solder tail 904 is not proximate to an upright surface of the support member 806, one of a plurality of conductive leads 810, 812, 912, 914 may be soldered between the solder tail 904 and its corresponding trace 910 on the male edge connector 808. Each of the conductive leads 810, 812, 912, 914 may be formed from, for example, a copper, nickel, or gold alloy.

A Slot 1 edge connector 804 comprises four rows of solder tails 904, 906. When the solder tails 904, 906 of such an edge connector 804 are inserted through holes in a T-shaped support member 806, it is preferable that two rows of solder tails extend through the crossbar of the support member 806 on each side of the support member's upright. Furthermore, it is preferable that two rows of solder tails 906 (one row on each side of the support member) be sufficiently proximate to the male edge connector 808 so that they may be directly soldered to traces 908 of same. The additional two rows of solder tails 904 may be coupled to traces 910 of the male edge connector 808 via a plurality of conductive leads 810, 812, 912, 914.

The solder tails 904, 906 of the female edge connector 804 must also be soldered to transmission paths 900, 902 in the flex circuit 802. For those solder tails 904 which are coupled to the male edge connector 808 via the plurality of conductive leads 810, 812, 912, 914, the solder tails 904 may be soldered (i.e., electrically coupled) to transmission paths 900, 902 in the flex circuit 802 in a separate solder operation, or alternatively, may be soldered to transmission paths 900, 902 in the flex circuit 802 at the same time that the plurality of conductive leads 810, 812, 912, 914 are soldered to the solder tails 904 of the female edge connector 804 (thereby eliminating a second round of soldering operations).

Figure 10:
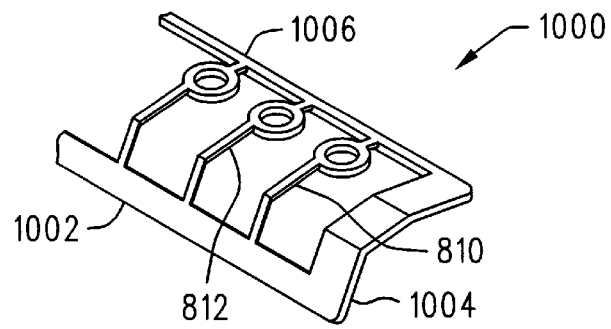
FIG. 10 is a perspective view of a lead frame carrying a plurality of the conductive leads shown in FIG. 8.

For easier placement and soldering of the plurality of conductive leads 810, 812, 912, 914, a number of leads 810, 812 may be created, for example, by painting a lead frame with photoresist and then etching away those portions of the lead frame which are not painted with the photoresist. In this manner, a lead frame 1000 as shown in FIG. 10 may be created. Note that the etched lead frame 1000 comprises carrier portions 1002–1006 which may be removed (e.g., broken off) after the plurality of conductive leads 810, 812 in the lead frame 1000 are soldered to appropriate solder tails and/or edge connector traces of the FIG. 8 edge connector interposing probe 800.

6. A Fifth Embodiment

A fifth embodiment of an edge connector interposing probe 1100 is pictured in FIG. 11, and differs from the fourth embodiment of an edge connector interposing probe 800 in that its support member 1102 is planar rather than T-shaped. Again, the preferred height of the support member is 14.52 mm ±0.50 mm.

7. A Sixth Embodiment

A sixth embodiment of an edge connector interposing probe 1200 is pictured in FIG. 12, and comprises a flex circuit 1202 having a plurality of transmission paths formed therein, a female edge connector 1204 having a plurality of solder tails extending therefrom, and a plurality of test equipment connectors 1206–1214 which are electrically coupled to subsets of the plurality of transmission paths in the flex circuit 1202. The flex circuit 1202 and female edge connector 1204 are coupled to one another as in the fourth embodiment 800, supra. However, the solder tails are not coupled with a male edge connector, but rather, are soldered directly to a PC board 1216. In this manner, an edge connector interposing probe 1200 may be integrated into a PC board 1216 or the like which is under test. Such an edge connector interposing probe 1200 adds no additional length to the paths of signals flowing through the edge connector 1204, and therefore provides a great deal of accuracy, in lieu of ease of removability.

8. Additional Features

Unlike previous edge connector interposing probes, the edge connector interposing probes 100, 600, 700, 800, 1100, 1200 described herein may be inserted into environments with a high component density. For example, previous edge connector interposing probes mandated that components mounted on a PC board 1216 under test be positioned up to centimeters away from an edge connector into which an interposing probe is to be inserted (to make room for the probe's substantial width and inflexible hardware for routing probed signals to test equipment). The flex circuit arrangement of the interposing probes (e.g., 100) described herein can be folded very close to the female edge connector (e.g., 102) of the interposing probe. As a result, the interposing probes 100, 600, 700, 800, 1100, 1200 described herein are only minimally wider than the female edge connector 102 which is to be placed in a production PC board.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. An edge connector interposing probe, comprising:
   a) a first edge connector having a plurality of solder tails extending therefrom;
   b) a support member having a second edge connector formed thereon;
   c) means for electrically coupling the solder tails of the first edge connector to traces of the second edge connector;
   d) at least one flex circuit having a plurality of transmission paths formed therein, wherein a first subset of the transmission paths is electrically coupled to solder tails of the first edge connector in a manner which enables the first subset of transmission paths to,
      i) sense signals flowing between solder tails of the first edge connector and traces of the second edge connector; and
      ii) route the sensed signals away from the conductive paths formed by the means which electrically couple solder tails of the first edge connector to traces of the second edge connector; and
   e) at least one test equipment connector which is electrically coupled to a second subset of the plurality of transmission paths of the at least one flex circuit.

2. An edge connector interposing probe as in claim 1, wherein the means for electrically coupling the plurality of solder tails of the first edge connector to traces of the second edge connector comprises a plurality of conductive leads, each lead being electrically coupled to a solder tail of the first edge connector and a trace of the second edge connector.

3. An edge connector interposing probe as in claim 2, wherein the means for electrically coupling the plurality of solder tails of the first edge connector to traces of the second edge connector comprises solders between ones of the plurality of solder tails and ones of the traces of the second edge connector.

4. An edge connector interposing probe as in claim 1, further comprising a plurality of probe tip resistors, wherein each of the plurality of transmission paths of the at least one flex circuit which is electrically coupled to a solder tail of the first edge connector is electrically coupled to one of the plurality of probe tip resistors, at a point in the transmission path which is proximate to the electrical coupling of the transmission path to a solder tail of the first edge connector.

5. An edge connector interposing probe as in claim 1, wherein the support member is a rectangular wafer having a height within a range of 14.02 mm–15.02 mm.

6. An edge connector interposing probe as in claim 1, wherein:
 a) the support member is T-shaped;
 b) the crossbar of the T-shaped support member has a plurality of holes therein; and
 c) the plurality of holes receive the plurality of solder tails of the first edge connector.

7. An edge connector interposing probe as in claim 6, wherein the T-shaped support member has a height within a range of 14.02 mm–15.02 mm.

8. An edge connector interposing probe as in claim 6, wherein:
 a) the means for electrically coupling the plurality of solder tails of the first edge connector to traces of the second edge connector comprises a plurality of conductive leads, each lead being electrically coupled to a solder tail of the first edge connector and a trace of the second edge connector; and
 b) the plurality of conductive leads are electrically coupled to solder tails of the first edge connector at points on the solder tails which lie under the crossbar of the T-shaped support member.

9. An edge connector interposing probe as in claim 1, wherein:
 a) the at least one flex circuit is a single flex circuit having a plurality of holes therein;
 b) the plurality of holes receive the plurality of solder tails of the first edge connector; and
 c) the single flex circuit is sandwiched between the first edge connector and the support member.

10. An edge connector interposing probe as in claim 9, wherein:
 a) the single flex circuit comprises a plurality of independently maneuverable arms; and
 b) each arm carries a test equipment connector which is electrically coupled to a different subset of the plurality of transmission paths of the at least one flex circuit.

11. An edge connector interposing probe as in claim 1, wherein the first and second subsets of the plurality of transmission paths of the at least one flex circuit are equivalent subsets.

12. An edge connector interposing probe, comprising:
 a) a first edge connector having a plurality of solder tails extending therefrom;
 b) a support member;
 c) at least one flex circuit, having:
  i) a plurality of transmission paths formed therein;
  ii) at least one first portion in which various ones of the plurality of transmission paths are electrically coupled to various ones of the plurality of solder tails; and
  iii) at least one second portion which conforms to at least one surface of the support member, the at least one second portion comprising exposed portions of a subset of the plurality of transmission paths which form traces of a second edge connector; and
 d) at least one test equipment connector which is electrically coupled to a subset of the plurality of transmission paths of the at least one flex circuit.

13. An edge connector interposing probe as in claim 12, wherein:
 a) one of the at least one second portions of a single one of the at least one flex circuits conforms to two opposite surfaces of the support member; and
 b) exposed portions of transmission paths in the single one of the at least one flex circuits form traces of the second edge connector.

14. An edge connector interposing probe as in claim 12, wherein each of the at least one second portions of the at least one flex circuit is bonded to the support member.

15. An edge connector interposing probe as in claim 12, further comprising a plurality of probe tip resistors, wherein each transmission path of the at least one flex circuit which is electrically coupled to a solder tail of the first edge connector is electrically coupled to one of the plurality of probe tip resistors, at a point in the transmission path which is proximate to the electrical coupling of the transmission path to a solder tail of the first edge connector.

16. An edge connector interposing probe as in claim 12, wherein the support member is a rectangular wafer having a height within a range of 14.02 mm–15.02 mm.

17. An edge connector interposing probe as in claim 12, wherein:
 a) the support member is T-shaped;
 b) the crossbar of the T-shaped support member has a plurality of holes therein; and
 c) the plurality of holes receive the plurality of solder tails of the first edge connector.

18. An edge connector interposing probe as in claim 17, wherein the T-shaped support member has a height within a range of 14.02 mm–15.02 mm.

19. An edge connector interposing probe as in claim 12, wherein:
 a) the at least one flex circuit is a single flex circuit having a plurality of holes therein; and
 b) the plurality of holes receive the plurality of solder tails of the first edge connector.

20. An edge connector interposing probe as in claim 12, wherein:
 a) the single flex circuit comprises a plurality of independently maneuverable arms; and
 b) each arm carries a test equipment which is electrically coupled to a different subset of the plurality of transmission paths of the at least one flex circuit.

21. An edge connector interposing probe, comprising:
 a) at least one flex circuit having a plurality of transmission paths formed therein;
 b) an edge connector having a plurality of solder tails extending therefrom, wherein a subset of the plurality of solder tails are electrically coupled to transmission paths of the at least one flex circuit;
 c) at least one test equipment connector which is electrically coupled to a subset of the plurality of transmission paths of the at least one flex circuit; and
 d) a plurality of probe tip resistors, wherein each transmission path of the at least one flex circuit which is electrically coupled to a solder tail of the edge connector is electrically coupled to one of the plurality of probe tip resistors, at a point in the transmission path which is proximate to the electrical coupling of the transmission path to a solder tail of the edge connector.

22. A method of constructing an edge connector interposing probe, comprising:
 a) inserting a plurality of solder tails extending from a first edge connector through a plurality of holes in at least one flex circuit;
 b) electrically coupling transmission paths in the at least one flex circuit to the plurality of solder tails; and
 c) electrically coupling solder tails of the first edge connector to traces of a second edge connector formed on a support member; and c) electrically coupling transmission paths in the at least one flex circuit to solder tails of the first edge connector to enable the transmission paths so coupled to,
   i) sense signals flowing between solder tails of the first edge connector and traces of the second edge connector; and
   ii) route the sensed signals away from conductive paths formed by the electrical couplings of solder tails of the first edge connector and traces of the second edge connector.

23. A method as in claim 22, wherein the support member is T-shaped, further comprising inserting the plurality of solder tails through a plurality of holes in the crossbar of the T-shaped support member.

24. A method as in claim 23, wherein the plurality of solder tails are first inserted through the plurality of holes in the at least one flex circuit, and then inserted through the plurality of holes in the crossbar of the T-shaped support member.

25. A method as in claim 23, wherein the plurality of solder tails are first inserted through the plurality of holes in the crossbar of the T-shaped support member, and then inserted through the plurality of holes in the at least one flex circuit.

26. A method as in claim 22, wherein electrically coupling solder tails of the first edge connector to traces of the second edge connector formed on the support member comprises:
   a) electrically coupling a subset of the plurality of solder tails to a plurality of conductive leads; and
   b) electrically coupling the plurality of conductive leads to a subset of the traces of the second edge connector.

27. A method as in claim 22, further comprising electrically coupling probe tip resistors to a subset of transmission paths of the at least one flex circuit, at points in each transmission path which are substantially proximate to points at which the transmission paths are electrically coupled to solder tails of the first edge connector.

28. A method of constructing an edge connector interposing probe, comprising:
   a) conforming a first portion of at least one flex circuit to two opposite surfaces of a support member, the first portion of the at least one flex circuit comprising exposed transmission paths which form a first edge connector;
   b) inserting a plurality of solder tails extending from a second edge connector through a plurality of holes in at least one second portion of the at least one flex circuit; and
   c) electrically coupling transmission paths in the at least one flex circuit to the plurality of solder tails.

29. A method as in claim 28, wherein:
   a) the support member is T-shaped; and
   b) conforming the first portion of the at least one flex circuit to two opposite surfaces of the support member comprises conforming the first portion of the at least one flex circuit to the upright surfaces of the T-shaped support member;
further comprising:
   c) inserting the plurality of solder tails through a plurality of holes in the crossbar of the T-shaped support member.

30. A method as in claim 28, further comprising electrically coupling probe tip resistors to a subset of transmission paths of the at least one flex circuit, at points in each transmission path which are substantially proximate to points at which the transmission paths are electrically coupled to solder tails of the second edge connector.

* * * * *